United States Patent [19]

Guruprasad

[11] Patent Number: 4,937,786
[45] Date of Patent: Jun. 26, 1990

[54] BINARY HOLOGRAM TRANSDUCER USING MAGNETIC BUBBLES

[76] Inventor: Venkata Guruprasad, c/o V.V.S.Rau, 1/21 Vidyapeetha circle, Bangalore 560028, India

[21] Appl. No.: 715,748

[22] Filed: Mar. 25, 1985

[51] Int. Cl.$^5$ .................. G11C 19/08; G11C 11/42
[52] U.S. Cl. ........................ 365/10; 365/122; 350/3.67
[58] Field of Search ............... 365/10, 122; 350/375, 350/3.6, 3.61, 3.67; 250/568, 225

[56] References Cited

U.S. PATENT DOCUMENTS

| | | | |
|---|---|---|---|
| 3,698,010 | 10/1972 | Lee | 365/122 |
| 3,971,887 | 7/1976 | Lin et al. | 365/10 |
| 4,229,072 | 10/1980 | Torok et al. | 365/122 |

*Primary Examiner*—James W. Moffitt

[57] ABSTRACT

A hologram transducer using the Faraday effect in magnetic bubble devices for recording and reproducing the amplitude and phase distributions over a section of a beam of coherent light is disclosed. The transducer spatially modulates the intensity, by using linear polarization, and the phase, by using circular polarization, of light transmitted through a magnetic bubble device. Using linear polarization and a single magnetic bubble domain to traverse in a sequence the possible storage positions in the magnetic bubble device, the transducer samples at each of these positions the intensity of the transmitted light. Using in addition a coherent reference beam of light to interfere with the light being measured, the transducer samples the phase in the half range of 0 through $\pi$ radians at these positions. Further, using a quarter cycle phase shift in the reference beam, the transducer resolves the phase values over the full range of 0 through $2\pi$ radians. Because of the localization of the sample values by the magnetic bubbles to the order of the wavelength of the light, optical holograms may be directly recorded as electrical signals by the transducer and the corresponding images reconstructed by the transducer from the electrical signals.

14 Claims, 1 Drawing Sheet

BINARY HOLOGRAM TRANSDUCER USING MAGNETIC BUBBLES

BACKGROUND OF THE INVENTION

1. Technical Field

This invention relates to the recording and display of optical scenes by holography.

2. Background Art

In the prior art of optical holography, holograms of general optical scenes are primarily recorded on high resolution photographic emulsions, though for certain very simple scenes, the holograms may be generated by computation. The prior art is dependent on the use of photographic emulsions. In the prior art, the images are reconstructed by reproducing optical wavefronts.

SUMMARY OF THE INVENTION

The transducer is a new means for general optical holography not depending on photographic emulsions. The transducer provides a new capability for sampling and recording waves of coherent light over a surface and generating waves of light matching the recorded waves in amplitude and phase distributions.

In the following, the term 'localization' is intended to refer to the width of a sampling window, while the term 'resolution' more properly describes a sampling interval. An 'optical wave-section' is intended to mean a cross-section of a beam of light, such as defined by a surface on which the light is incident.

The transducer provides a means for recording and reproducing optical wave-sections, rather than just the optical wavefronts corresponding to a scene. It may be noted that conventionally, the term hologram refers to the phase record of a wave-section. The transducer achieves the recording and the reproduction of wave-sections with localization of the order of the wavelength of the light, for light ranging from infra-red to ultra-violet in frequency, by the use of magnetic bubbles of dimensions comparable to the wavelength of the light.

The transducer uses the Faraday effect in magnetic bubble devices. The Faraday effect consists of unequal retardation induced by a longitudinal magnetic field, of the two circularly polarized components of the transmitted light. The Faraday effect causes spatial polarization modulation, that is, variation of the plane of polarization across the transmitted light, in accordance with the pattern of bubbles in the magnetic bubble array layer, when linearly polarized light is used. The Faraday effect causes spatial phase modulation, that is, variation of the phase across the transmitted light, in accordance with the pattern of bubbles in the magnetic bubble array layer, when circularly polarized light is used. Spatial modulation occurs because the portions of the bubble array layer not containing magnetic bubbles affect the transmitted light differently from the portions that do contain the bubble domains. Spatial polarization modulation becomes converted to spatial intensity modulation when the transmitted light encounters a linear polarizer oriented so as to transmit mainly the light that passed through the bubble domains and to remove the rest of the transmitted light. Spatial intensity modulation may be alternatively done with the selective transmission of the light that did not pass through bubbles, by a different orientation of the polarizer.

In the transducer, the recording of an optical wave-section involves sampling and the measurement of the samples. Sampling is done with a single magnetic bubble array layer using a single magnetic bubble, which may be called the sampler bubble, traversing the sampling points in a sequence and thereby scanning the wave-section where the light is intercepted by the layer. The sampling points correspond to locations in the bubble array layer where a bubble domain may be stored.

Spatial intensity modulation by the sampler bubble, effected by placing linear polarizers before and after the bubble array layer in the path of the light, allows only the light transmitted by the sampler bubble to be transmitted through the second polarizer and measured as the sample intensity by a photodetector. In the recording of a wave-section, at each sample point, the amplitude is computed from the sample intensity, since the intensity is the square of the amplitude.

The measurement of phase requires a coherent reference beam of light to interfere with the wave-section and form an interference pattern at the bubble array layer. With the reference beam interfering with the wave-section, the sample intensity then corresponds to the cosine of the phase of the wave-section at the sampling point. Hence, using a reference beam, the cosine of the phase is measured to yield a value for the phase in the half range of 0 through $\pi$ radians. To disambiguate the phase over the full range of 0 through $2\pi$ radians, the phase quadrature is measured as follows. The reference beam is shifted in phase by a quarter cycle, such as by inserting a suitably thick transparent plate in its path. The sample intensity is then proportional to the sine (in place of the cosine) of the phase of the wave-section at that sampling point. Hence, using a quarter-cycle phase-shift in the reference beam, the sine of the phase is measured. From the values measured for the cosine and the sine of the phase at the sampling point, the phase is computable in the full range of 0 through $2\pi$ radians.

It is known in the prior art of holography that the reference beam makes possible the measurement of the cosine of the phase, and, when the reference beam is offset in phase by a quarter cycle, also makes possible the measurement of the sine of the phase. However, it is difficult to combine the cosine and the sine values as obtained on different photographic emulsions into a single hologram for display, which is why in prior art only the cosine of phase information is used as the hologram. This invention makes it possible to record both the amplitude and the phase distributions (including the phase quadrature for total resolution of the phase angle) over an optical wave-section.

In an embodiment, the transducer may be made to measure the amplitude and the phase (and phase quadrature) successively at each sample point, thus recording the wave-section in one scan. Alternatively, the transducer may be made to measure in one scan only the amplitude at each sampling point, then use a second scan for measuring the phase at each point, and use a third scan for measuring the phase quadrature (that is, the sine of the phase), over the wave-section. All that must be ensured is that the reference beam is turned off during amplitude measurement, and is turned on during phase measurements, and is further offset in phase by a quarter cycle, such as by the introduction of a suitably thick transparent plate in its path, during the measurement of the phase quadrature.

The transducer also makes possible the full use of the amplitude and phase information to reproduce a corresponding optical wave-section, whereas in conventional holographic display, only the half range phase information is used. Conventional holography therefore succeeds in reproducing only the wavefronts, which are the shape of the light waves pictured by constant phase surfaces, at a distance from the hologram. In contrast, the transducer is able to reproduce the wave-section itself in amplitude and phase, leading to more accurately reproduced wavefronts.

The reconstruction of a wave-section is achieved in the transducer by successive spatial intensity modulation, for reproducing the amplitude distribution of the reconstruction beam, and spatial phase modulation, for reproducing the phase distribution, using magnetic bubble array layers, polarizers and quarter-wave plates (for converting linear polarization to circular and the vice versa). For the reconstruction, a pattern of magnetic bubbles corresponding to the amplitude distribution is stored in the bubble array layer performing the spatial amplitude modulation. Similarly, the layer used for spatial phase modulation is filled with bubbles in a pattern corresponding to the phase distribution of the wave-section. The reconstruction beam, which like the reference beam used in the recording, is a coherent beam of light bearing no information in the form of modulation over its cross-section, may be, in a particular embodiment, first intensity modulated and then phase modulated, or alternatively, first phase modulated and then intensity modulated. All that must be ensured is that the reconstruction beam is linearly polarized when it reaches a bubble array layer containing bubbles in amplitude distribution pattern, and that the beam is circularly polarized when it reaches a layer holding bubbles in phase distribution pattern. For obtaining the required polarizations, polarizers and quarter-wave plates are appropriately placed between the bubble array layers, as will be illustrated by the description of the preferred embodiments.

DRAWING REFERENCE NUMERALS

Figure 1:
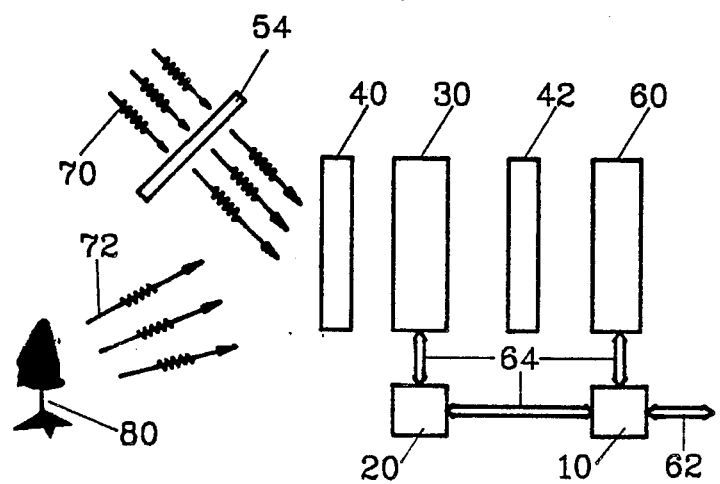
FIG. 1 schematically illustrates a configuration of the transducer for recording an optical wave-section.

10 Binary Hologram Transducer—Control Unit
20 Magnetic Bubble Device—Control Unit interacting with 10 and controlling 30, 32, 34
30, 32, 34 Magnetic Bubble array layers controlled by 20
30 Bubble layer, for recording a section of 72 causing spatial polarization modulation by sampler bubble 92.
32, 34 Bubble layers for reconstruction, each spatially modulating 74 in intensity or phase.
40 Linear polarizer, polarizing 72 and 70.
42 Linear polarizer, serving as analyzer, converting the spatial polarization modulation caused by 40 into intensity modulation.
50, 52, 53, 54, 56 Optical devices, for polarization or phase-shifting.
50, 52, 53 Optical devices ensuring appropriate polarization of 74 before it reaches layers 32, 34 respectively.
54 Optical device introducing quarter cycle delay in 70.
56 Linear polarizer.
60, 62, 64 Electrical parts.
60 Photodetector producing an electrical signal.
62 Electrical bus connecting 10 to power supply, computer, etc. of external world.
64 Electrical circuits internal to the transducer.
70, 72, 74 Coherent light beams.
70 Reference beam for phase measurements on 72.
72 Light from 80, whose section at 30 is measured.
74 Reconstruction beam.
80 Holographed optical scene.
82 Reconstructed image of 80.
90 a sampling point in 30.
92 sampler bubble in 30.
94 the scan path of 92 in 30.

DESCRIPTION OF THE PREFERRED EMBODIMENTS:

In FIG. 1, the transducer control unit 54 has the interface 62 to the external world. The transducer control unit 54 controls the magnetic bubble device control unit 20 via electrical connection 64. The bubble device control unit 20 generates and positions the sampler bubble (92 in FIG. 2) in the bubble array layer 30. Coherent light 72 from an optical scene 80 is intercepted by the bubble array layer 30, at whose position the transducer samples the light 72 over its cross-section as follows.

The light 72 is first linearly polarized by a polarizer 40 before it reaches the layer 30, which contains a sampler bubble (92 in FIG. 2) to produce spatial polarization modulation of the light 72 when it emerges from the layer 30. The modulation corresponds to the single sampler bubble (92 in FIG. 2). Hence, when the light 72 finally passes through the second polarizer 42, the resulting spatial intensity modulation allows only the portion of the light 72 that passed through the sampler bubble (92 in FIG. 2) to reach the photodetector 60; the remaining portion of the light 72 is removed by the polarizer 42. Thus the light 72 is sampled by the sampler bubble (92 in FIG. 2) for measurement by the photodetector 60.

At a particular sampling point (90 in FIG. 2) the light 72 is first sampled for amplitude as described in the previous paragraph, because the photodetector measures the intensity of light reaching it and intensity is the square of amplitude. The output of the photodetector, with suitable processing, therefore yields the value of the amplitude at the sampling point.

At the same sampling point, the phase of the light 72 is next measured as follows. A reference light beam 70, coherent with the light 72 is now made to interfere with the light 72 at the bubble layer 30. In the present embodiment, the beam 70 also passes through the polarizer 40 ensuring that the polarization of the beam 70 and of the light 72 match so that they interfere at layer 30. The interference makes the total light incident on the sampling point at layer 30 proportional to the cosine of the phase of the light 72 reaching that poi-nt. The intensity now measured by the photodetector 60 is therefore proportional to the cosine of the phase. Suitable processing of the photodetector output (60) yields the value of the cosine of the phase. From the cosine value, the phase itself is only computable over the half range of 0 through π radians. To determine the phase unambiguously over the full range of 0 through 2π radians, the sine of the phase is measured next. An optical device 54 is introduced in the path of the reference beam 70 for effectively shifting the phase of the beam 70 by a quarter cycle (π/2 radians). The intensity now measured by the photodetector 60 becomes proportional to the sine, rather than the cosine, of the phase of the light 72 at layer 30. Suitable processing of this sine value together with the cosine value previously measured yields the value of the phase of the light 72 unambiguously over the full range of 0 through 2π radians.

Figure 2:
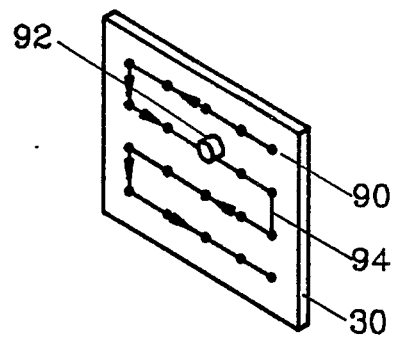
FIG. 2 schematically illustrates an arrangement of the sampling points and the scan path of the sampler bubble, that may be used in the transducer of FIG. 1.

FIG. 2 illustrates the bubble layer 30 of FIG. 1, containing a single sampler bubble 92. The sampler bubble is positioned successively at each sampling point 90 along the scan path 94. At each sampling point 90, the amplitude of the light 72 is first measured as explained above, keeping the reference light beam 70 turned off; then the reference beam 70 is turned on and the cosine of the phase of the light 72 at that sampling point 90 is measured without the optical device 54; then finally, the optical device 54 is positioned in the path of the reference beam 72 as shown, and the sine of the phase of the light 72 at that point 90 is measured. After the amplitude, the cosine of the phase, and the sine of the phase of the light 72 are all measured in succession as explained above, the sampler bubble 92 is moved to the next sampling point along the scan path 94.

The transducer may be alternatively arranged to have the sampler bubble 92 first successively positioned at each sampling point 90 along the scan path 94, with only the amplitude being measured as described above, at each sampling point 90; then again successively positioned at each of the sampling points 90 along the path 94, with only the cosine of the phase being measured as described, at each point 90; then finally once again successively positioned at each point 90 along the path 94, with only the sine of the phase being now measured as described, at each point 90.

To summarize the operation of the transducer while recording a wave-section, the reference beam 70 is turned off to measure the intensity of the light 72, and is turned on to measure the phase of the light 72. Further, the optical device 54 is inserted in the path of the beam 70 only when measuring the sine of the phase of the light 72; without the device 54, the cosine of the phase is obtained.

Figure 3:
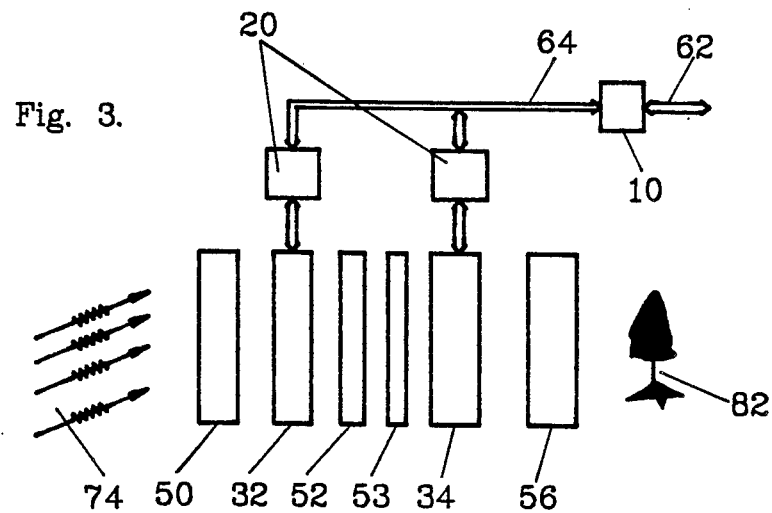
FIG. 3 schematically illustrates an a configuration of the transducer for reproducing an optical wave-section to reconstruct an image.

In FIG. 3, the transducer control unit 10 is interfaced to the external world via the bus 62. The transducer control unit 10 controls the magnetic bubble device control units 20 via the connections 64. Each bubble device control unit 20 operates a magnetic bubble array layer (32, 34 respectively). The coherent reconstruction light beam 74 is spatially modulated over its cross-section, first in amplitude and then in phase as follows.

The coherent reconstruction beam 74 is first linearly polarized by the optical device 50, and then passes through the bubble array layer 32. The intensity distribution pattern, to be modulated onto the reconstruction beam 74, is stored in the bubble layer 32. The reconstruction beam 74, when it reaches device 52, is therefore spatially polarization modulated in accordance with the intensity pattern stored in layer 32. Optical device 52 is a linear polarizer followed by a quarter-wave plate. The reconstruction beam 74, becomes spatially intensity modulated after transmission through the linear polarizer device 52, and is then converted to circular polarization by the quarter wave plate device 53. The reconstruction beam 74, when emerging from the device 52 is therefore spatially intensity modulated and circularly polarized.

The phase distribution pattern is stored in the second bubble array layer 34. The reconstruction beam 74, already modulated in amplitude and being circularly polarized, becomes spatially phase modulated by the layer 34. The reconstruction beam upon emerging from the layer 34 is thus (a) spatially modulated in intensity in accordance with the intensity pattern stored in the bubble layer 32, and (b) spatially modulated in phase in accordance with the phase pattern stored in the bubble layer 34. The reconstruction beam 74 is then converted from circular to linear polarization by the optical device 56, containing a polarizer, so that the beam 74, after emerging from device 56, is able to diffract and interfere to form the optical image 82.

It should be noted that coherence of the beam 74 and presence of the device 56 are only required to reconstruct the image 82, and that the spatial modulation in both intensity and phase is already achieved before the beam 74 reaches the device 56. Also, the device 50, for linearly polarizing the coherent reconstruction beam 74, is needed only if the beam 74 is not already linearly polarized at its source. Either bubble layer (32, 34) can be used for a particular modulation by storing the corresponding pattern of bubble domains in it and selecting the optical devices 50, 52, 53 and 56 appropriately for the required polarization. Alternate embodiments for the configuration shown in FIG. 3 are therefore as follows:

| # | modulation by layer 32 | device 50 | modulation by layer 34 | device 52, 53 |
|---|---|---|---|---|
| 1 | intensity | LP | phase | LP + QWP |
| 2 | intensity | LP | intensity | none |
| 3 | phase | QWP | intensity | LP or QWP |
| 4 | phase | QWP | phase | none** |

LP = linear polarizer, QWP = quarter-wave plate.
**in embodiment 3 above, device 56 can be QWP instead.

The first of these embodiments is the one just described in detail.

For the purpose of recording, other embodiments of the transducer are possible, such as using more than one sampler bubble (92 in FIG. 2) simultaneously in the bubble array layer 30 (FIG. 1) and measuring corresponding sampled values by correspondingly many photodetectors 60.

While the invention has been particularly shown and described with reference to preferred embodiments thereof, it will be understood by those skilled in the art that the foregoing and other changes in form and detail may be made therein without departing from the spirit and scope of the invention.

I claim:

1. An optical sampling and modulating device for sampling the amplitude and the phase of a beam of light from a coherent source at a set of sampling points over a cross-section of the said beam, with localization approaching the wavelength of the said light, comprising
   a magnetic bubble array layer placed at the said cross-section so that the said light tends to pass through the layer,
   a polarizer means located in the path of the said light to polarize the said light before the said light reaches the said layer, a second polarizer means located in the path of the said light after the said layer, to selectively transmit one of the two portions of the said light, the portion which passed through magnetic bubbles in the said layer and the portion which did not, a photodetector means to measure the light emerging from the second polarizer means, a reference beam of light coherent with the said source and interfering with the first beam at the said cross-section, a phase-shifting means located in the path of the said reference beam before the reference beam reaches the said layer, to shift the phase of the said reference beam, and a bubble layer control means to position a single magnetic bubble successively at each of the said sampling points to measure the amplitude and the phase of the said first beam at that sampling point, in which the said reference beam is turned off to measure the amplitude of the said first beam, in which the said reference beam is turned on to determine the phase of the said first beam in the half range of 0 through $\pi$ radians, and in which the phase of the said reference beam is shifted by the said phase-shifting means by a quarter cycle to further resolve the phase of the said first beam over the full range 0 through $2\pi$ radians at each of the said sampling points.

2. A device according to claim 1,
in which the phase-shifting means is a suitably thick transparent plate.

3. A device according to claim 1,
in which the said single magnetic bubble is held at each of the said sampling points for the measurement of both the amplitude and the phase of the said first beam at that sampling point.

4. A device according to claim 1,
in which the said single magnetic bubble is successively held at each of the said sampling points for the measurement of the amplitude of the said first beam, and then held successively at each of the said sampling points for the measurement of the phase of the said first beam, over the said cross-section.

5. An optical sampling and modulating device for modulating the amplitude and the phase of a beam of light at a set of sampling points over a cross-section of the said beam, with localization approaching the wavelength of the said light, comprising a magnetic bubble array layer, in which a pattern of magnetic bubbles is stored corresponding to the amplitude distribution with which the said beam is to be modulated, a second magnetic bubble array layer, in which a pattern of magnetic bubbles is stored corresponding to the phase distribution with which the said beam is to be modulated, an analyzer means located after the said first layer in the path of the said beam, with the polarization axis of the said analyzer so aligned as to selectively transmit one of the two portions of the said beam, the portion which passed through magnetic bubbles in the said first layer and the portion which did not, a polarizer means located in the path of the said beam before the said first layer, to linearly polarize the said beam before the said beam reaches the said first layer, and a circular polarization means located in the path of the said beam before the said second layer, to circularly polarize the said beam before the said beam reaches the said second layer, in which the said bubble array layers are so arranged that the said beam first passes through one of the said layers and then through the other layer.

6. A device according to claim 5,
in which the said beam first passes through the said first layer and then through the said second layer, so that the said beam is modulated first in amplitude and then in phase.

7. A device according to claim 5,
in which the said beam first passes through the said second layer and then through the said first layer, so that the said beam is modulated first in phase and then in amplitude.

8. A device according to claim 6,
in which the said circular polarization means is a quarter-wave plate.

9. A device according to claim 7,
in which the said polarizer means is a quarter-wave plate.

10. A device according to claim 7,
in which the said polarizer means is a linear polarizer.

11. An optical sampling and modulating device for modulating a beam of light at a set of sampling points over its cross-section with localization approaching the wavelength of the said light, comprising a magnetic bubble array layer positioned so that the said beam passes through it, a bubble array control means to store a pattern of bubbles corresponding to the pattern of modulation desired, in the said layer, and in which, for modulating the phase of the said beam over the said cross-section, a circular polarization means is located in the path of the said beam before it reaches the said layer to circularly polarize the said beam, and in which, for modulating the amplitude of the said beam over the said cross-section wherein the said beam is already modulated over its cross-section by transmission through another magnetic bubble array layer also containing a pattern of bubbles, a linear polarization means is located in the path of the said beam before it reaches the said first layer to linearly polarize the said beam, and the said beam is passed through an analyzer after transmission through the said first layer.

12. A device according to claim 11, in which the said beam carries no information in the form of amplitude or phase modulation over its cross-section, and the said circular polarization means is a quarter-wave plate.

13. A device according to claim 11, in which the said beam is already modulated in phase by the said second layer, and the said linear polarization means is a linear polarizer.

14. A device according to claim 11, in which the said beam is already modulated in phase by the said second layer and the said linear polarization means is a quarter-wave plate.

* * * * *